United States Patent
Okagaki et al.

(10) Patent No.: US 6,737,870 B2
(45) Date of Patent: May 18, 2004

(54) CAPACITANCE MEASUREMENT METHOD

(75) Inventors: Takeshi Okagaki, Tokyo (JP); Motoaki Tanizawa, Tokyo (JP); Tatsuya Kunikiyo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/287,537

(22) Filed: Nov. 5, 2002

(65) Prior Publication Data

US 2003/0227291 A1 Dec. 11, 2003

(30) Foreign Application Priority Data

Jun. 7, 2002 (JP) .............................. 2002-166880

(51) Int. Cl.⁷ ..................... G01R 31/08; G01R 27/26
(52) U.S. Cl. ............................... 324/519; 324/658
(58) Field of Search ............................ 324/519, 658, 324/765, 681, 769, 520, 528

(56) References Cited

U.S. PATENT DOCUMENTS

2002/0101252 A1 * 8/2002 Cheng et al. ............... 324/681
2003/0098695 A1 * 5/2003 Hsieh et al. ................ 324/548

FOREIGN PATENT DOCUMENTS

JP  2001-338007  12/2001

OTHER PUBLICATIONS

James C. Chen, et al., "An On–Chip, Attofarad Interconnect Charge–Based Capacitance Measurement (CBCM) Technique", IEEE, IEDM, 1996, pp. 69–72.

* cited by examiner

Primary Examiner—N. Le
Assistant Examiner—Amy He
(74) Attorney, Agent, or Firm—Oblon, Spivak, McClelland, Maier & Neustadt, P.C.

(57) ABSTRACT

A capacitance measurement method is provided which is capable of measuring an accurate capacitance value even if a leakage current on a level that cannot be ignored occurs in a capacitance to be measured. In step S1, a test current $IC_{norm}$ is measured by using a normal PMOS gate potential as a PMOS gate potential for providing on/off control of PMOS transistors in a predetermined cycle. In step S2, a current $IC_{rat}$ is measured by using, as the PMOS gate potential, a multiplied on-time PMOS gate potential, the "L" period and fall time of which are integral multiples of those of the normal PMOS gate potential. In step S3, based on the currents $IC_{norm}$, $IC_{rat}$, a leakage current $IR_t$ is eliminated and the amount of capacity current CIC consisting only of a capacitance current component $IC_t$ is calculated. In step S5, a target capacitance is obtained based on the capacity current CIC and a charge frequency $f_{rat}$ obtained in step S4.

3 Claims, 6 Drawing Sheets

F I G. 7
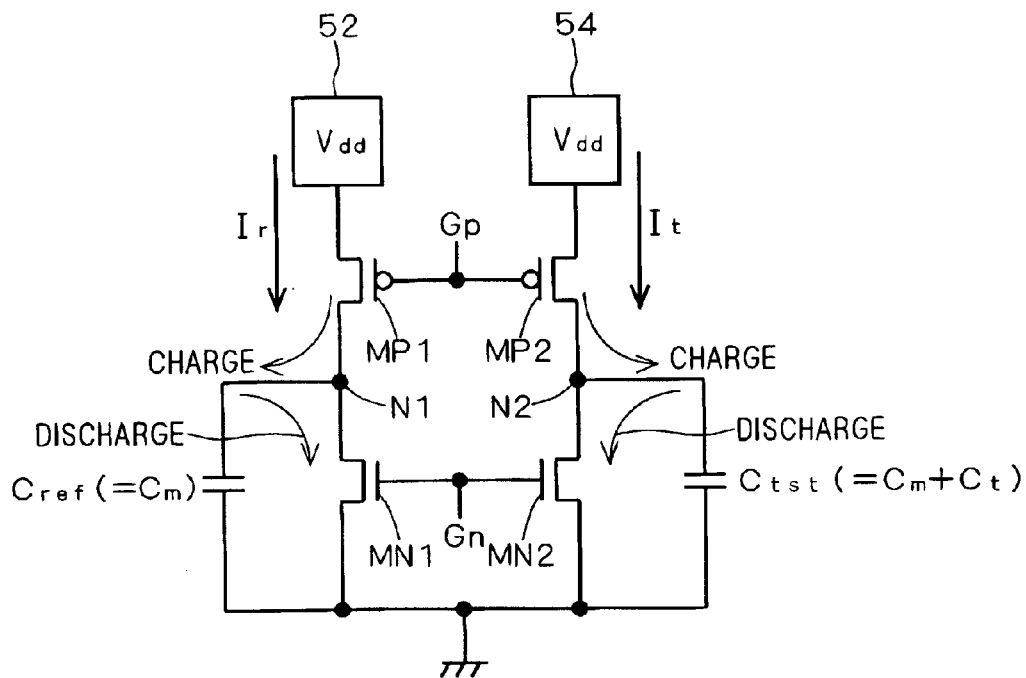
F I G. 8
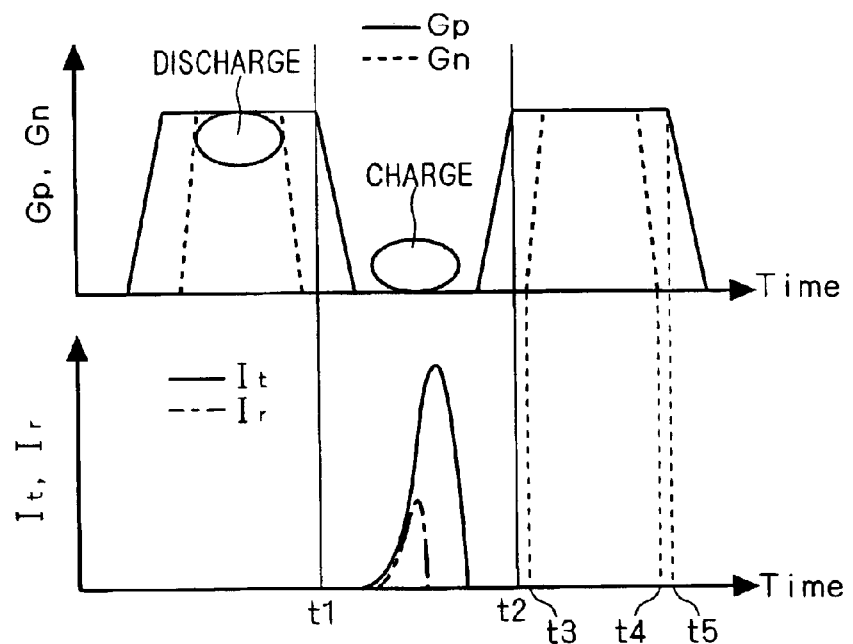

CAPACITANCE MEASUREMENT METHOD

BACKGROUND OF THE INVENTION

1. Field of the Invention

The present invention relates to a capacitance measurement method using a CBCM (Charge Based Capacitance Measurement) circuit.

2. Description of the Background Art (Basic Principle of CBCM Technique)

A CBCM technique is a method for measuring capacitance values on a sub-fF level ($\leq 10^{-15}$ F) that cannot be measured with sufficient accuracy by AC measurement equipment such as an LCR meter.

FIG. 7 is a circuit diagram illustrating a configuration of a CBCM circuit adopting a conventional CBCM technique. As shown, a PMOS transistor MP1 and an NMOS transistor MN1 are connected in series, and a PMOS transistor MP2 and an NMOS transistor MN2 are connected in series. The source of the PMOS transistor MP1 is connected to a power pad 52, the source of the PMOS transistor MP2 is connected to a power pad 54, and the sources of the NMOS transistors MN1 and MN2 are connected in common to ground level. A PMOS gate potential Gp is applied to the gates of the PMOS transistors MP1 and MP2, while an NMOS gate potential Gn is applied to the gates of the NMOS transistors MN1 and MN2.

A reference capacitance $C_{ref}$ (reference value=$C_m$ (dummy capacitance)) is provided between drain (node N1) and source of the NMOS transistor MN1, and a test capacitance $C_{tst}$ (capacitance value=$C_m$+$C_t$ (target capacitance)) is provided between drain (node N2) and source of the NMOS transistor MN2. The purpose of the CBCM circuit shown in FIG. 7 is to measure the target capacitance $C_t$.

FIG. 8 is a timing chart illustrating the operation of the CBCM circuit shown in FIG. 7. Hereinbelow, with reference to this drawing, capacitance measurement by the conventional CBCM circuit will be described.

As shown, input voltage waveforms of the PMOS gate potential Gp and the NMOS gate potential Gn are such that at least either the NMOS transistors MN1, MN2 or the PMOS transistors MP1, MP2 are in the off state at any given time. Thus, no short circuit current flows from the PMOS transistor MP1 to the NMOS transistor MN1 or from the PMOS transistor MP2 to the NMOS transistor MN2.

As shown in FIG. 8, during a time interval between t1 and t2, the PMOS transistors MP1 and MP2 are turned on to supply currents $I_r$ and $I_t$ from the power pads 52 and 54 and thereby to charge the reference capacitance $C_{ref}$ and the test capacitance $C_{tst}$. During this time, the NMOS transistors MN1 and MN2 are both in the off state and thus, potentials at the nodes N1 and N2 which are connected respectively to the reference capacitance $C_{ref}$ and the test capacitance $C_{tst}$ reach a power supply potential $V_{dd}$.

During a time interval between t2 and t3, the PMOS transistors MP1, MP2 and the NMOS transistors MN1, MN2 are all in the off state. Ideally, the accumulated charges on the reference capacitance $C_{ref}$ and the test capacitance $C_{tst}$ should be stored and the nodes N1 and N2 should be maintained at the power supply potential $V_{dd}$.

During a time interval between t3 and t4, only the NMOS transistors MN1 and MN2 are in the on state. Thus, the accumulated charges on the reference capacitance $C_{ref}$ and the test capacitance $C_{tst}$ are discharged to ground level and the potentials at the nodes N1 and N2 reach a ground potential $V_{ss}$.

During a time interval between t4 and t5, all the MOS transistors are in the off state. Ideally, the reference capacitance $C_{ref}$ and the test capacitance $C_{tst}$ should be maintained at the ground potential $V_{ss}$ since the completion of discharge.

These are one cycle T of operation (the time from t1 to t5) and hereinafter, this operation will be repeated. To be observed by the measurement equipment is average values of the currents $I_r$ and $I_t$ with respect to time. Where f(=1/T) is the frequency of the gate input waveforms (Gp, Gn), the target capacitance value $C_t$ can be obtained from the following equations (1) and (2).

$$I_C = I_t - I_r \tag{1}$$

$$C_t = C_{tst} - C_m = \frac{I_C}{V_{dd} \cdot f} \tag{2}$$

The advantage of the CBCM technique is that, as expressed in Equations (1) and (2), the dummy capacitance (parasitic capacitance) $C_m$ can be cancelled and a desired target capacitance $C_t$ can be obtained.

In this way, the CBCM technique allows measurement of capacitance values. In the capacitance measurement technique using the CBCM circuit, however, if there is leakage of charge from the test resistance $C_{tst}$ and the amount of leakage cannot be ignored as compared with the amount of charging current (e.g., 1% or more as a current value), treating the observed current $I_t$ as a charging current will cause an error of the measured capacitance value.

FIG. 9 is a circuit diagram showing an equivalent circuit on the side of the test capacitance $C_{tst}$, where there is no leakage current. As shown, if there is no leakage current, the circuit configuration is equivalent to that in which the test capacitance $C_{tst}$ and a resistance $R_s$ (such as a transistor's resistance) are connected in series.

FIG. 10 is a circuit diagram showing an equivalent circuit on the side of the test capacitance $C_{tst}$, where there is a leakage current. As shown, if there is a leakage current, the circuit configuration is such that a resistance $R_t$ is additionally connected parallel to the test capacitance $C_{tst}$.

FIG. 11 is a circuit diagram showing an equivalent circuit of the CBCM circuit when there is a leakage current. As shown, the circuit configuration shown in FIG. 10 is connected between drain and source of the NMOS transistor MN2, and the current $I_t$ supplied from the power pad 54 flows as a current $IC_t$ through the test capacitance $C_{tst}$ and flows as a current $IR_t$ through the resistance $R_t$.

FIG. 12 is an explanatory diagram for indicating a problem of the leakage current. As shown, even during the period in which the PMOS transistor MP1 is in the on state with the application of the PMOS gate potential Gp (i.e., during the period in which the NMOS transistor MN1 should be in the off state), the current $IR_t$ will flow as a leakage current.

Capacitance measurement (extraction) using the conventional CBCM technique assumes that currents observed on the side of power supply potential $V_{dd}$ are all used for charging the MOS transistors forming the CBCM circuit, the test capacitance $C_{tst}$, and the dummy capacitance $C_m$. Thus, if there is a leakage current, even a charge which actually corresponds to a leakage current flowing through the resistance $R_t$ is treated as an accumulated charge, which causes a problem that the measured capacitance value may become larger than the actual capacitance value.

SUMMARY OF THE INVENTION

An object of the present invention is to provide a capacitance measurement method which is capable of measuring an accurate capacitance value even if a leakage current on a level that cannot be ignored occurs in a capacitance to be measured.

According to the present invention, the capacitance measurement method is for measuring a capacitance to be measured which is connected to a CBCM (Charge Based Capacitance Measurement) circuit including a charge transistor, and includes the following steps (a) to (e). The step (a) is to apply to the charge transistor a first control signal for controlling turning on/off of the charge transistor in a predetermined cycle, thereby to measure an amount of first test current to be supplied through the charge transistor to the capacitance to be measured. The step (b) is to apply to the charge transistor a second control signal for controlling turning on/off of the charge transistor in the predetermined cycle, thereby to measure an amount of second test current to be supplied through the charge transistor to the capacitance to be measured. A period during which the second control signal indicates an on state of the charge transistor is set to be predetermined times longer than that during which the first control signal indicates an on state of the charge transistor. The step (c) is to, based on the first and second test currents, eliminate a leakage current occurring incident to the capacitance to be measured and calculate an amount of capacity current used only for charging the capacitance to be measured. The step (d) is to calculate a charge frequency suitable for the amount of capacity current. The step (e) is to calculate a capacitance value of the capacitance to be measured based on the amount of capacity current and the charge frequency.

The amounts of the first and second test currents measured by the execution of the above steps (a) and (b) each are equal to the sum of the amounts of capacity current and leakage current. The second test current has the same amount of capacity current as the first test current, but has a predetermined times larger amount of leakage current. Thus, in step (c), the amount of the first test current is increased by the predetermined times and operations such as obtaining a difference from the amount of the second test current is performed, whereby an accurate amount of capacity current used only for charging the capacitance to be measured can be calculated. Consequently, by the execution of the subsequent steps (d) and (e), it is possible to calculate an accurate capacitance value of the capacitance to be measured, from which a leakage current occurring incident to the capacitance to be measured has been eliminated.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a circuit diagram illustrating a configuration of a CBCM circuit adopting a conventional CBCM technique;

FIG. 8 is a timing chart showing the operation of the CBCM circuit shown in FIG. 7;

DESCRIPTION OF THE PREFERRED EMBODIMENTS

Figure 1:
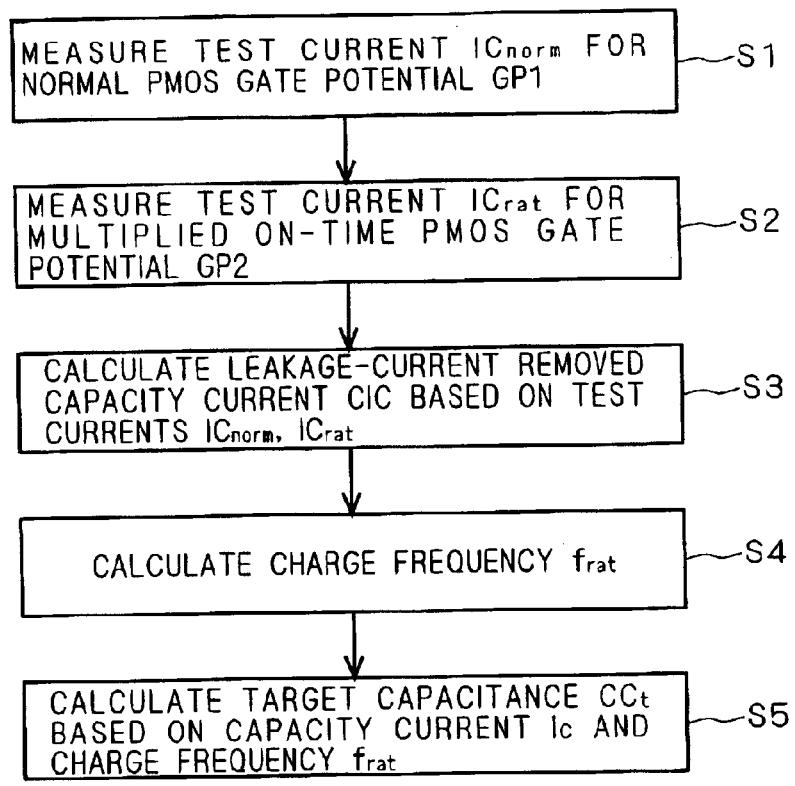
FIG. 1 is a flow chart showing a sequence of processing in a capacitance measurement method according to a preferred embodiment of the present invention.
Figure 11:
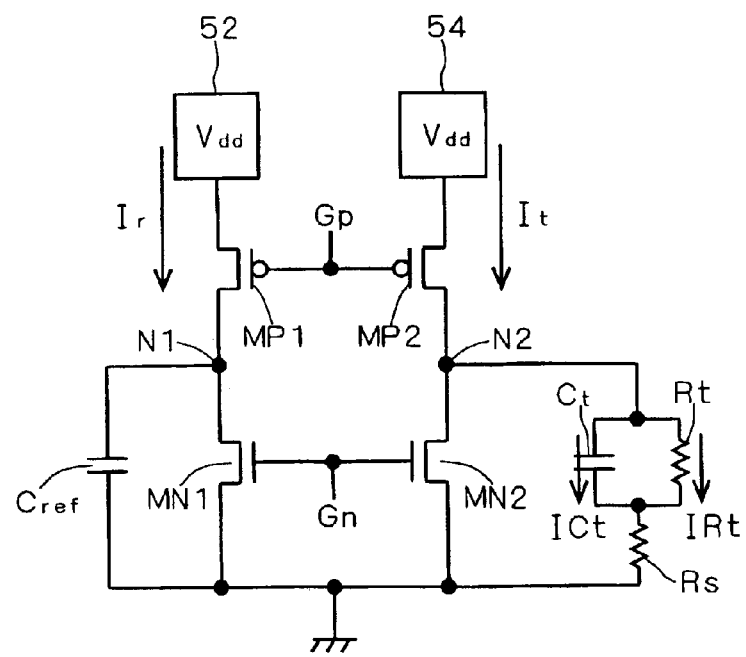
FIG. 11 is a circuit diagram showing an equivalent circuit of the CBCM circuit when there is a leakage current.
Figure 12:
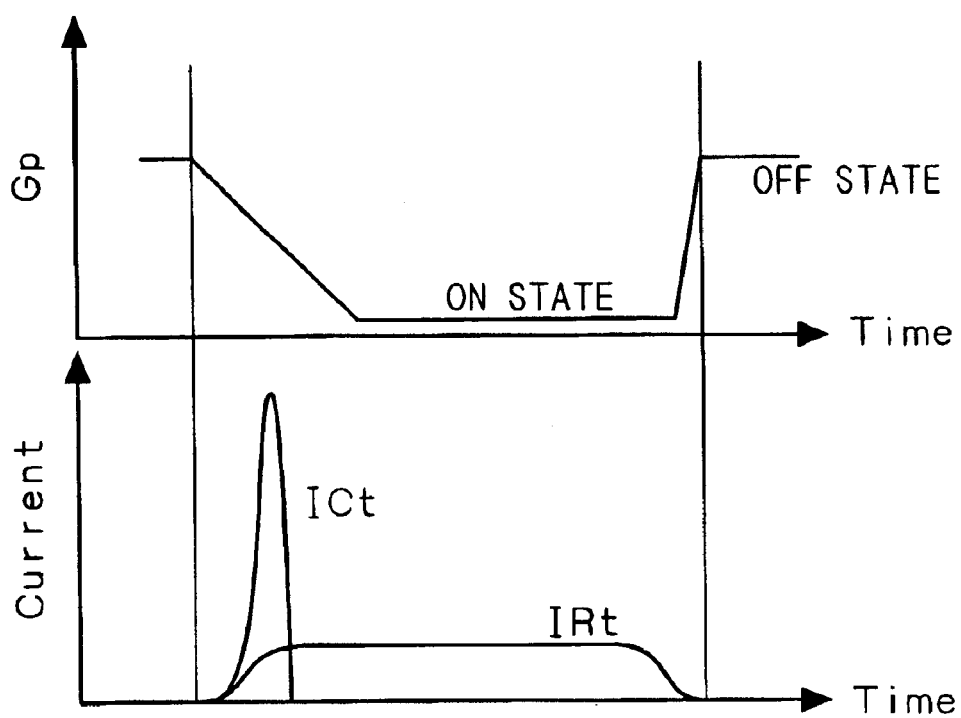
FIG. 12 is an explanatory diagram for indicating a problem of the leakage current.

FIG. 1 is a flow chart showing a sequence of processing in a capacitance measurement method according to a preferred embodiment of the present invention. A CBCM circuit has a similar circuit configuration to those shown in FIGS. 7 and 11.

Referring to FIG. 1, in step S1, a test current $IC_{norm}$ which corresponds to the current $I_c$ in Equation (1) is measured by using a normal PMOS gate potential Gp1 as the PMOS gate potential Gp for providing on/off control of the PMOS transistors MP1 and MP2 in a predetermined cycle.

In step S2, a test current $IC_{rat}$ which corresponds to the current $I_c$ in Equation (1) is measured by using, as the PMOS gate potential Gp, a multiplied on-time PMOS gate potential Gp2, the "L" period and fall time of which are integral multiples of those of the normal PMOS gate potential Gp1. Accordingly, both the currents $IC_{norm}$ and $IC_{rat}$ are currents from which the current $I_r$ for charging the dummy capacitance $C_m$ has been eliminated.

Figure 2:
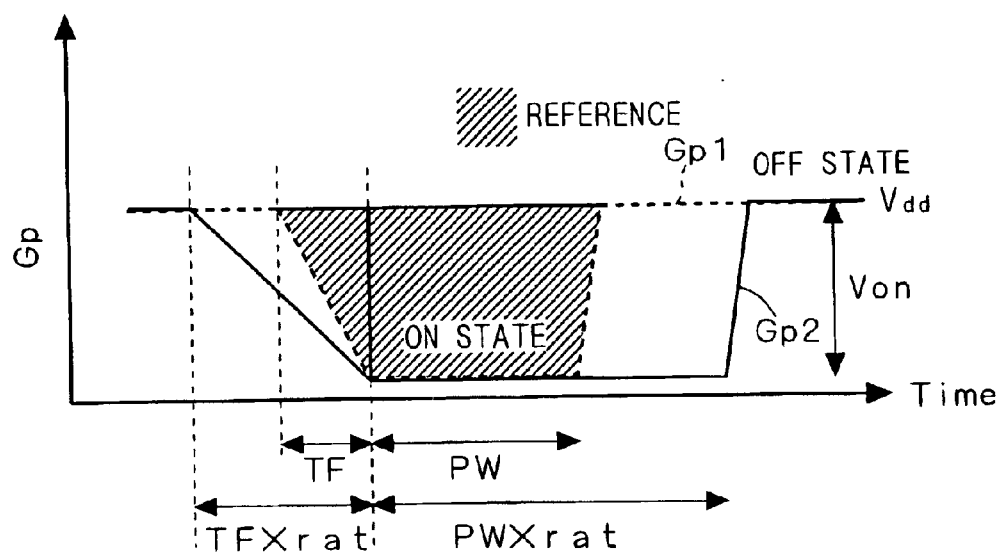
FIG. 2 is a waveform diagram illustrating signal waveforms of PMOS gate potentials.

FIG. 2 is a waveform diagram illustrating the normal PMOS gate potential Gp1 and the multiplied on-time PMOS gate potential Gp2. The normal PMOS gate potential Gp1 has a normally used PMOS on time PW ("L" period") and fall time TF (turn-on transition time). Where $V_{on}$ is the operating voltage of the MOS transistors in the CBCM circuit.

On the other hand, the multiplied on-time PMOS gate potential Gp2 has the same turn-on/off cycle of the PMOS transistors MP1 and MP2 as the normal PMOS gate potential Gp1, but has a different duty cycle and slew rate.

That is, the multiplied on-time PMOS gate potential Gp2, as shown in FIG. 2, has a PMOS on time (PW×rat) which is an integral multiple of the PMOS on time PW of the normal PMOS gate potential Gp1, and has a fall time (TF×rat) which is an integral multiple of the fall time TF, where rat is the integer multiplication factor.

The rise times (turn-off transition times) of the normal PMOS gate potential Gp1 and the multiplied on-time PMOS gate potential Gp2 are set short enough as compared with the fall time TF. Thereby, an error due to discharge occurring in the target capacitance such as a gate capacitance of the PMOS transistor can be minimized.

Figure 3:
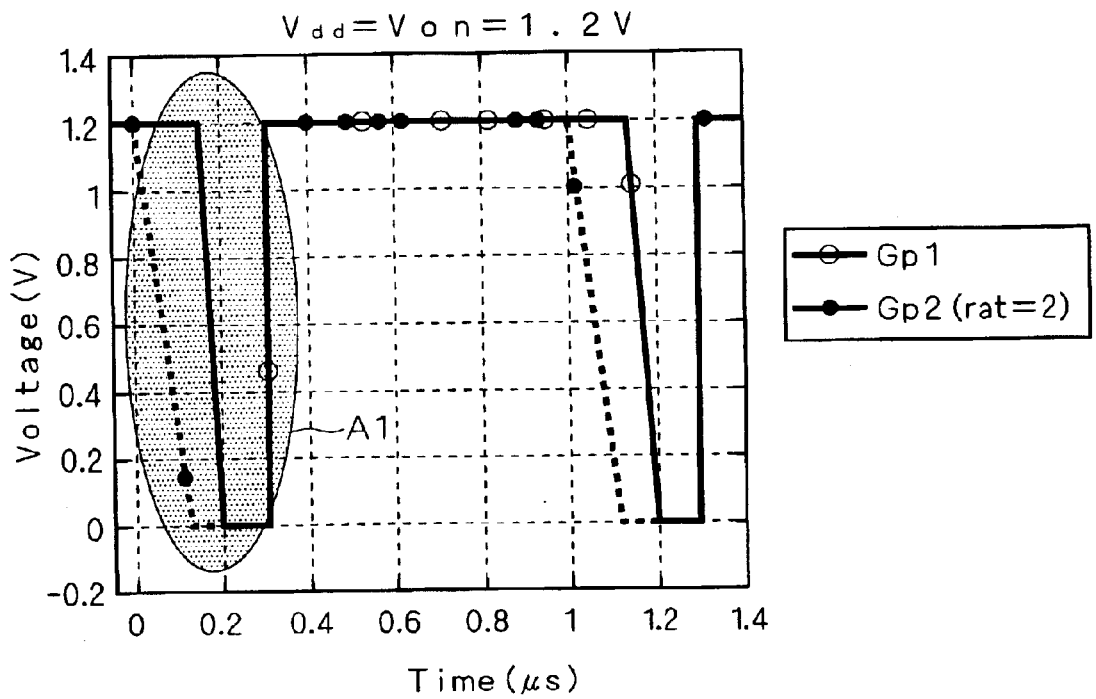
FIG. 3 is a waveform diagram illustrating a detailed example of signals of the PMOS gate potentials.
Figure 4:
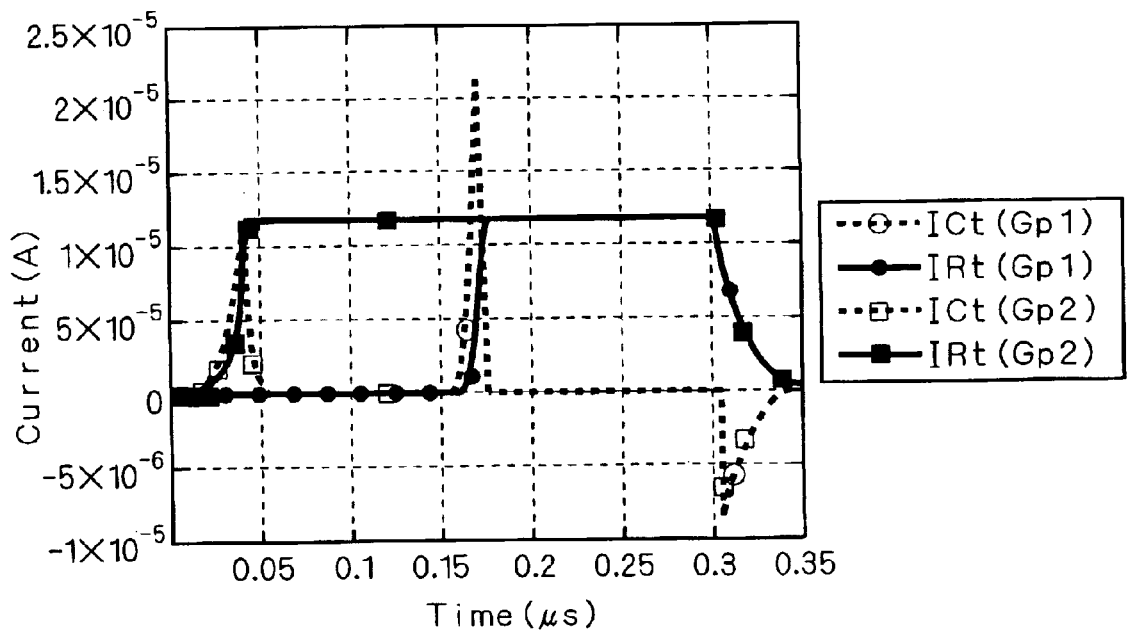
FIG. 4 is a waveform diagram illustrating simulation results of capacity current and leakage current in part of FIG. 3.

FIG. 3 is a waveform diagram illustrating a detailed example of signals of the normal PMOS gate potential Gp1 and the multiplied on-time PMOS gate potential Gp2. FIG. 4 is a waveform diagram illustrating simulation results of the currents $IC_t$ and $IR_t$ in a region A1 of FIG. 3. Here, the integer multiplication factor rat is "2".

As shown in FIG. 4, since the leakage current $IR_t$ flowing through the resistance $R_t$ which is a leakage component depends on the potential at the node N2, if the fall time TF is long enough, the amount of charge flowing through the resistance $R_t$ is multiplied by the integer multiplication factor rat (=2). On the other hand, the current $IC_t$ flows only momentarily for charging the test capacitance $C_{tst}$ and thus, no difference in the amount of charge occurs between the normal PMOS gate potential Gp1 and the multiplied on-time PMOS gate potential Gp2.

Figure 5:
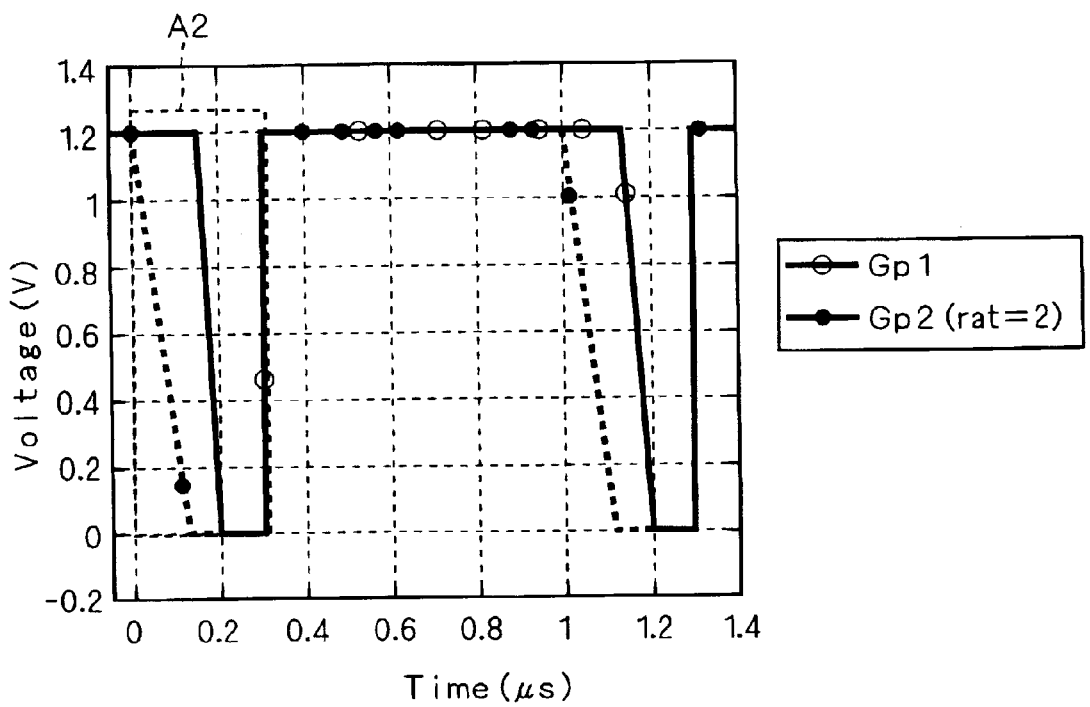
FIG. 5 is a waveform diagram illustrating a detailed example of signals of the PMOS gate potentials.
Figure 6:
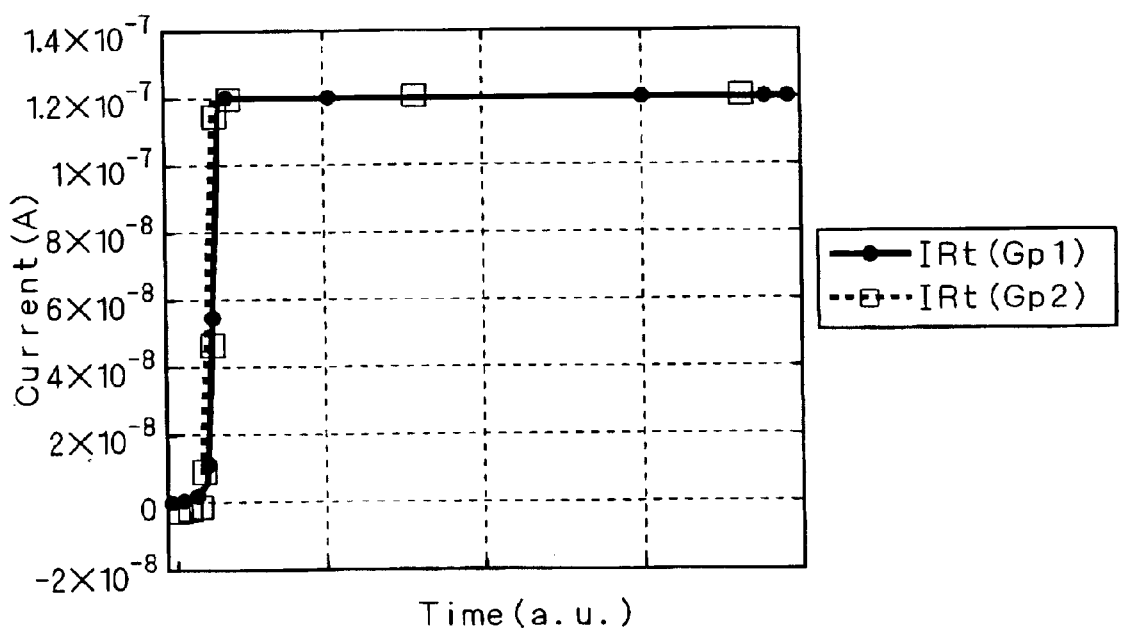
FIG. 6 is a waveform diagram illustrating simulation results of leakage current in part of FIG. 5.
Figure 9:
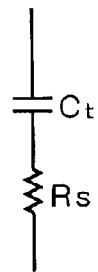
FIG. 9 is a circuit diagram showing an equivalent circuit on the side of a test capacitance, where there is no leakage current.
Figure 10:
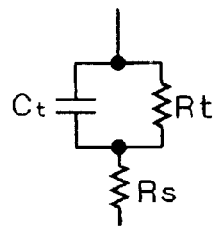
FIG. 10 is a circuit diagram showing an equivalent circuit on the side of the test capacitance, where there is a leakage current.

FIG. 5 is a waveform diagram illustrating a detailed example of signals of the normal PMOS gate potential Gp1 and the multiplied on-time PMOS gate potential Gp2. FIG. 6 is a waveform diagram illustrating simulation results of the leakage current $IR_t$ in a region A2 of FIG. 5, which is plotted in arbitrary units (a.u.) using the integer multiplication factor rat. Here, the integer multiplication factor rat is "2".

As shown in FIG. 6, the value of leakage current $IR_t$ for the normal PMOS gate potential Gp1 matches that for the multiplied on-time PMOS gate potential Gp2. Thus, during one cycle of the PMOS gate potential Gp, the amount of leakage current $IR_t$ when the multiplied on-time PMOS gate potential Gp2 is applied, at which time a period in which the leakage current $IR_t$ flows is rat times longer, can be measured to be rat times larger than that when the normal PMOS gate potential Gp1 is applied, where rat is the integer multiplication factor.

The simulation results of FIGS. 3 to 6 show that, for the multiplied on-time PMOS gate potential Gp2, as compared with the normal PMOS gate potential Gp1, the amount of leakage current charge $IR_t$ per unit time (i.e., the average current value with respect to time) is multiplied by the integer multiplication factor rat, but the amount of current charge $IC_t$ per unit time remains unchanged.

Referring back to FIG. 1, in step S3, based on the currents $IC_{norm}$ and $IC_{rat}$, the leakage current $IR_t$ is eliminated and the amount of capacity current CIC consisting only of a capacity current component $IC_t$ is calculated, using the following equation (3).

$$CIC = \text{rat} \cdot IC_{norm} - IC_{rat} \quad (3)$$

As previously described, since the amount of leakage current $IR_t$ for the current $IC_{rat}$ is measured to be rat times larger than that for the current $IC_{norm}$, the capacity current CIC obtained from Equation (3) is a current from which a leakage current component has been completely eliminated.

In step S4, a charge frequency $f_{rat}$ is calculated. Since the currents $IC_{norm}$ and $IC_{rat}$ have the same value of current $IC_t$, the amount of current corresponding to $(\text{rat}-1) \times IC_t$ is calculated as the capacity current CIC by solving Equation (3) in step S3. This is equivalent to (rat−1) charging; thus, the charge frequency $f_{rat}$ can be obtained from the following equation (4).

$$f_{rat} = (\text{rat}-1) \cdot f \quad (4)$$

In step S5, based on the capacity current CIC and the charge frequency $f_{rat}$, a target capacitance $CC_t$ is obtained from the following equation (5).

$$CC_t = C_{tst} - C_m = \frac{CIC}{V_{dd} \cdot f_{rat}} \quad (5)$$

(Simulation Verification Result)

Based on the currents $IC_{norm}$ and $IC_{rat}$ obtained by simulations performed where the target capacitance $C_t$ ($CC_t$)=100 fF, the resistance for leakage $R_t$=100 KΩ, the resistance $R_s$=1200 Ω and the dummy capacitance $C_m$=0 F, the target capacitance is obtained by the capacitance measurement method according to the preferred embodiment. The resultant target capacitance $CC_t$ is 102 fF, which can fall within 2% error.

The target capacitance $C_t$ ($CC_t$), the resistance $R_s$ and the resistance $R_t$ described above are respectively a target capacitance $C_t$ and a resistance $R_s$ which are extracted from a MOSFET with an insulation film thickness of 1.6 nm (a value measured by ellipsometry) by using an already-existing two-frequency plan, and a resistance $R_t$ which is about one tenth of the extracted value (at which value the leakage current is likely to occur).

The target capacitance $C_t$ obtained in a similar manner by the conventional capacitance measurement method according to Equations (1) and (2) is 1.4 pF, the error of which is 1400%.

Thus, the capacitance measurement method according to the preferred embodiment can, by solving Equation (3) in step S3, accurately calculate the amount of capacity current CIC used only for charging the test capacitance $C_{tst}$.

Consequently, by the execution of the subsequent steps S4 and S5, it is possible to calculate an accurate capacitance value of the test capacitance $C_{tst}$, from which a leakage current incident to the test capacitance $C_{tst}$ has been eliminated.

At this time, since the multiplied on-time PMOS gate potential Gp2 has the fall time which is set to be rat times longer than that of the normal PMOS gate potential Gp1 as well as the "L" period, an accurate amount of the capacity current can be obtained by eliminating a leakage current component with certainty.

The signal waveform of the NMOS gate potential Gn according to this preferred embodiment is set to have a duty cycle and slew rate that are sufficient to cause discharge regardless of whether the PMOS gate potential Gp is the normal PMOS gate potential Gp1 or the multiplied on-time PMOS gate potential Gp2. Alternatively, the waveform of the NMOS gate potential Gn may be changed depending on whether the PMOS gate potential Gp is the normal PMOS gate potential Gp1 or the multiplied on-time PMOS gate potential Gp2.

While the invention has been shown and described in detail, the foregoing description is in all aspects illustrative and not restrictive. It is therefore understood that numerous modifications and variations can be devised without departing from the scope of the invention.

What is claimed is:

1. A capacitance measurement method for measuring a capacitance to be measured which is connected to a CBCM (Charge Based Capacitance Measurement) circuit including a charge transistor, said capacitance measurement method comprising the steps of:
   (a) applying to said charge transistor a first control signal for controlling turning on/off of said charge transistor in a predetermined cycle, thereby to measure an amount of first test current to be supplied through said charge transistor to said capacitance to be measured;
   (b) applying to said charge transistor a second control signal for controlling turning on/off of said charge transistor in said predetermined cycle, thereby to measure an amount of second test current to be supplied through said charge transistor to said capacitance to be measured, a period during which said second control signal indicates an on state of said charge transistor being set to be predetermined times longer than that during which said first control signal indicates an on state of said charge transistor;

(c) eliminating a leakage current occurring incident to said capacitance to be measured and calculating an amount of capacity current used only for charging said capacitance to be measured based on said first and second test currents;

(d) calculating a charge frequency suitable for said amount of capacity current; and (e) calculating a capacitance value of said capacitance to be measured based on said amount of capacity current and said charge frequency.

2. The capacitance measurement method according to claim 1, wherein
a turn-on transition time of said second control signal during which said second control signal transitions from a level indicating an off state to a level indicating an on state, is set to be said predetermined times longer than that of said first control signal.

3. The capacitance measurement method according to claim 2, wherein
turn-off transition times of said first and second control signals during which said first and second control signals transition from a level indicating an on state to a level indicating an off state, are both set to be shorter than said turn-on transition time of said first control signal.

* * * * *